United States Patent
Yan

(10) Patent No.: US 11,563,196 B2
(45) Date of Patent: Jan. 24, 2023

(54) FOLDABLE ORGANIC LIGHT EMITTING DIODE DISPLAY PANEL AND ORGANIC LIGHT EMITTING DIODE DISPLAY SCREEN

(71) Applicant: WUHAN CHINA STAR OPTOELECTRONICS SEMICONDUCTOR DISPLAY TECHNOLOGY CO., LTD., Wuhan (CN)

(72) Inventor: Bo Yan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 204 days.

(21) Appl. No.: 16/758,429

(22) PCT Filed: Feb. 14, 2020

(86) PCT No.: PCT/CN2020/075167
§ 371 (c)(1),
(2) Date: Apr. 23, 2020

(87) PCT Pub. No.: WO2021/109338
PCT Pub. Date: Jun. 10, 2021

(65) Prior Publication Data
US 2021/0408467 A1 Dec. 30, 2021

(30) Foreign Application Priority Data
Dec. 4, 2019 (CN) .......................... 201911227963.4

(51) Int. Cl.
*H01L 51/00* (2006.01)
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3258* (2013.01);
(Continued)

(58) Field of Classification Search
CPC ............. H01L 51/5253; H01L 51/0097; H01L 2251/5338; H01L 2251/301;
(Continued)

(56) References Cited

U.S. PATENT DOCUMENTS 9,601,717 B2 * 3/2017 Lee ...................... H01L 27/3262
10,290,691 B2 * 5/2019 Jeong .................. H01L 27/3262
(Continued)

FOREIGN PATENT DOCUMENTS

CN 107610598 A 1/2018
CN 109037469 A 12/2018
(Continued)

*Primary Examiner* — Ida M Soward
(74) *Attorney, Agent, or Firm* — PV IP PC; Wei Te Chung; Ude Lu

(57) ABSTRACT

A foldable organic light emitting diode (OLED) display panel and an OLED display screen having the fordable OLED display panel are provided. The foldable OLED display panel is provided with an effective display area and a non-display area. The effective display area has a folding region, a first display area and a second display area. The first display area and the second display area are disposed adjacent two lateral sides of the folding region, respectively. The foldable OLED display panel has a first spacer, a second spacer, and an encapsulation layer having a first organic layer and a first inorganic layer. The first organic layer is coated within the folding region and restricted to the folding (Continued)

region by the first spacer and the second spacer. The first inorganic layer is disposed on the first organic layer and completely covers the effective display area.

17 Claims, 3 Drawing Sheets

(52) U.S. Cl.
CPC .... *H01L 51/0097* (2013.01); *H01L 2251/301* (2013.01); *H01L 2251/5338* (2013.01)

(58) Field of Classification Search
CPC ............. H01L 27/3246; H01L 27/3258; H01L 27/3295; G02F 2001/133357
See application file for complete search history.

(56) References Cited

U.S. PATENT DOCUMENTS

| | | | | |
|---|---|---|---|---|
| 10,692,943 | B2* | 6/2020 | Kang | H01L 51/5246 |
| 10,707,429 | B2* | 7/2020 | Jin | H01L 27/3276 |
| 10,727,424 | B2* | 7/2020 | Tanaka | H01L 27/3276 |
| 11,031,445 | B2* | 6/2021 | Zheng | H01L 51/5253 |
| 11,049,915 | B2* | 6/2021 | Zeng | H01L 27/32 |
| 2010/0309172 | A1* | 12/2010 | Oh | H01L 27/326 257/E51.026 |
| 2013/0248867 | A1* | 9/2013 | Kim | H01L 27/3246 438/34 |
| 2014/0117336 | A1* | 5/2014 | Kim | H01L 27/3246 257/40 |
| 2015/0200237 | A1* | 7/2015 | Yim | H01L 51/525 257/40 |
| 2015/0207094 | A1* | 7/2015 | Hwang | H01L 51/5203 257/88 |
| 2016/0064461 | A1* | 3/2016 | Lee | H01L 27/3246 257/40 |
| 2016/0095172 | A1* | 3/2016 | Lee | H05B 33/14 313/504 |
| 2016/0300894 | A1* | 10/2016 | Park | H01L 27/3246 |
| 2016/0351852 | A1* | 12/2016 | Kim | H01L 51/5256 |
| 2017/0125734 | A1* | 5/2017 | Lee | H01L 51/5256 |
| 2017/0155075 | A1* | 6/2017 | Bi | H01L 27/3211 |
| 2017/0315645 | A1* | 11/2017 | Park | H01L 51/0097 |
| 2017/0331058 | A1* | 11/2017 | Seo | G09F 9/30 |
| 2018/0074358 | A1* | 3/2018 | Jeon | G02F 1/13338 |
| 2018/0130966 | A1 | 5/2018 | Yun et al. | |
| 2019/0035869 | A1* | 1/2019 | Kim | H01L 51/5234 |
| 2019/0035872 | A1* | 1/2019 | Um | H01L 27/3276 |
| 2019/0096974 | A1* | 3/2019 | Kim | H01L 51/5237 |
| 2019/0103569 | A1 | 4/2019 | Zhai et al. | |
| 2019/0148679 | A1 | 5/2019 | Li | |
| 2019/0165060 | A1* | 5/2019 | Choi | H01L 51/0097 |
| 2019/0173042 | A1* | 6/2019 | Lim | G02F 1/13394 |
| 2020/0168670 | A1* | 5/2020 | Kim | H01L 27/323 |
| 2020/0168823 | A1* | 5/2020 | Kim | H01L 51/5253 |
| 2020/0185428 | A1* | 6/2020 | Um | H01L 51/0097 |
| 2020/0194719 | A1* | 6/2020 | Choi | G09F 9/301 |
| 2021/0057658 | A1* | 2/2021 | Chen | H01L 51/0097 |
| 2021/0202535 | A1* | 7/2021 | Sun | H04M 1/02 |

FOREIGN PATENT DOCUMENTS

| | | |
|---|---|---|
| CN | 109616492 A | 4/2019 |
| CN | 109830184 A | 5/2019 |
| CN | 110085650 A | 8/2019 |
| CN | 110349974 A | 10/2019 |

* cited by examiner

FOLDABLE ORGANIC LIGHT EMITTING DIODE DISPLAY PANEL AND ORGANIC LIGHT EMITTING DIODE DISPLAY SCREEN

FIELD OF INVENTION

The present disclosure relates to a foldable organic light emitting diode (OLED) display panel and an organic light emitting diode (OLED) display screen thereof, and specifically, to a foldable OLED display panel which is capable for reducing the risks of cracks caused by bending to improve the encapsulation reliability, and an OLED display screen thereof.

BACKGROUND OF INVENTION

An organic light emitting diode (OLED) device has a characteristic of flexible display and is considered as a new generation of display technology. In mobile devices, especially in the field of smart phones, the OLED device has broad application prospects. With the development of display technology, display products with static bending function or dynamic bending function have become the development targets that have attracted much attention.

A thin film encapsulation structure of an OLED device is formed by a first inorganic encapsulation layer, an organic encapsulation layer, and a second inorganic encapsulation layer. It is characterized that the first inorganic encapsulation layer directly covers a pixel definition layer (PDL), so that the surface of the first inorganic encapsulation layer may be uneven due to the shape of the pixel definition layer, and thus there is a risk of cracks during bending the panel.

It is therefore necessary to provide a foldable organic light emitting diode display panel and an organic light emitting diode display screen to solve the problems existing in the conventional technology as described above.

SUMMARY OF DISCLOSURE

Technical Problem

A thin film encapsulation structure of an OLED device is formed by a first inorganic encapsulation layer, an organic encapsulation layer, and a second inorganic encapsulation layer. It is characterized that the first inorganic encapsulation layer directly covers a pixel definition layer (PDL), so that the surface of the first inorganic encapsulation layer may be uneven due to the shape of the pixel definition layer, and thus there is a risk of cracks during bending the panel.

Technical Solutions

An object of the present disclosure is to provide a foldable organic light emitting diode (OLED) display panel and an OLED display screen thereof. The foldable organic light emitting diode display panel has an encapsulation layer. The encapsulation layer comprises an organic layer to fill the gaps of a pixel definition layer in a folding region of the foldable organic light emitting diode display panel, such that an inorganic layer subsequently disposed on the pixel definition layer has a flat surface to reduce the risks of cracks in the foldable organic light emitting diode display panel during bending, and increase the service life of the foldable OLED display panel.

To achieve above objects, one embodiment of the present disclosure provides a foldable organic light emitting diode (OLED) display panel, comprising an effective display area having a folding region, a first display area and a second display area, wherein the first display area and the second display area are disposed adjacent two lateral sides of the folding region, wherein the foldable OLED display panel comprises:

a flexible functional layer comprising a substrate and a plurality of thin film transistor units;

a planarization layer disposed on the flexible functional layer;

a pixel definition layer disposed on the planarization layer;

a first spacer disposed on a first folding line between the folding region and the first display area over the pixel definition layer;

a second spacer disposed on a second folding line between the folding region and the second display area over the pixel definition layer; and an encapsulation layer covering the pixel definition layer, the first spacer and the second spacer;

wherein the encapsulation layer comprises a first organic layer and a first inorganic layer, the first organic layer is coated within the folding region and restricted to the folding region by the first spacer and the second spacer; and the first inorganic layer is disposed on the first organic layer and completely covers the effective display area.

In one embodiment of the present disclosure, the encapsulation layer further comprises a second organic layer and a second inorganic layer sequentially coated on the first inorganic layer and completely covering the effective display area.

In one embodiment of the present disclosure, the second organic layer is one or more of acrylic, epoxy resin, and silicone.

In one embodiment of the present disclosure, the second organic layer has an edge located inside an edge of the first inorganic layer.

In one embodiment of the present disclosure, the second inorganic layer is silicon nitride, silicon oxynitride, silicon oxide, or aluminum oxide.

In one embodiment of the present disclosure, the second inorganic layer has an edge located outside an edge of the second organic layer.

In one embodiment of the present disclosure, the first organic layer is one or more of acrylic, epoxy resin, and silicone.

In one embodiment of the present disclosure, the first spacer and the second spacer are photoresist spacer materials.

In one embodiment of the present disclosure, the first inorganic layer is silicon nitride, silicon oxynitride, silicon oxide, or aluminum oxide.

To achieve above objects, another embodiment of the present disclosure provides an organic light emitting diode display screen, comprising the abovementioned foldable organic light emitting diode display panel.

Beneficial Effects

The present disclosure provides a foldable organic light emitting diode (OLED) display panel and an OLED display screen thereof. The foldable organic light emitting diode display panel has an encapsulation layer. The encapsulation layer comprises an organic layer to fill the gaps of a pixel definition layer in a folding region of the foldable organic light emitting diode display panel, such that an inorganic layer subsequently disposed on the pixel definition layer has a flat surface to reduce the risks of cracks in the foldable organic light emitting diode display panel during bending, and increase the service life of the foldable OLED display panel.

DETAILED DESCRIPTION OF PREFERRED EMBODIMENTS

The detailed description of the following embodiments is used for exemplifying the specific embodiments of the present invention by referring to the accompany drawings. Directional terms described by the present invention, such as upper, lower, front, back, left, right, top, bottom, etc., are only directions by referring to the accompanying drawings, and thus the directional terms are used to describe and understand the present invention, but the present invention is not limited thereto.

Figure 1:
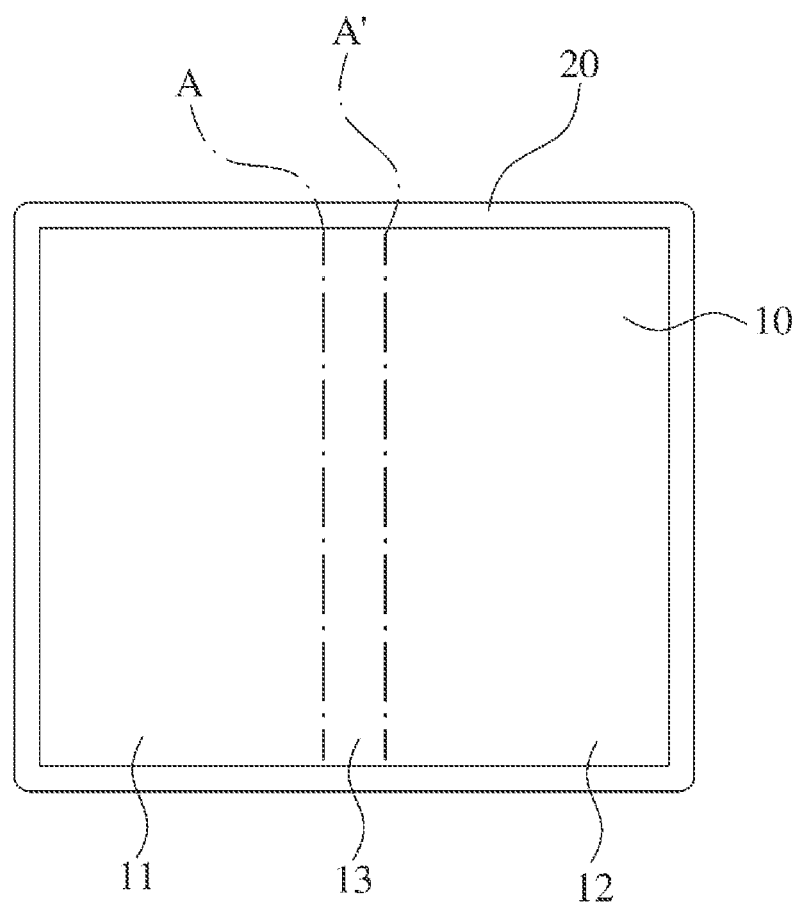
FIG. 1 is a top view of a foldable organic light emitting diode (OLED) display panel according to one embodiment of the present disclosure.

Please refer to FIG. 1. One embodiment of the present disclosure provides a foldable organic light emitting diode (OLED) display panel, comprising an effective display area 10 and a non-display area 20. The effective display area 10 comprises a first display area 11, a second display area 12, and a folding region 13. The first display area 11 and the second display area 12 are disposed adjacent two lateral sides of the folding region, respectively. There is a first folding line A between the first display area 11 and the folding region 13. There is a second folding line A' between the second display area 12 and the folding region 13. The foldable organic light emitting diode display panel can be bended along the first folding line A and the second folding line A.

Figure 2:
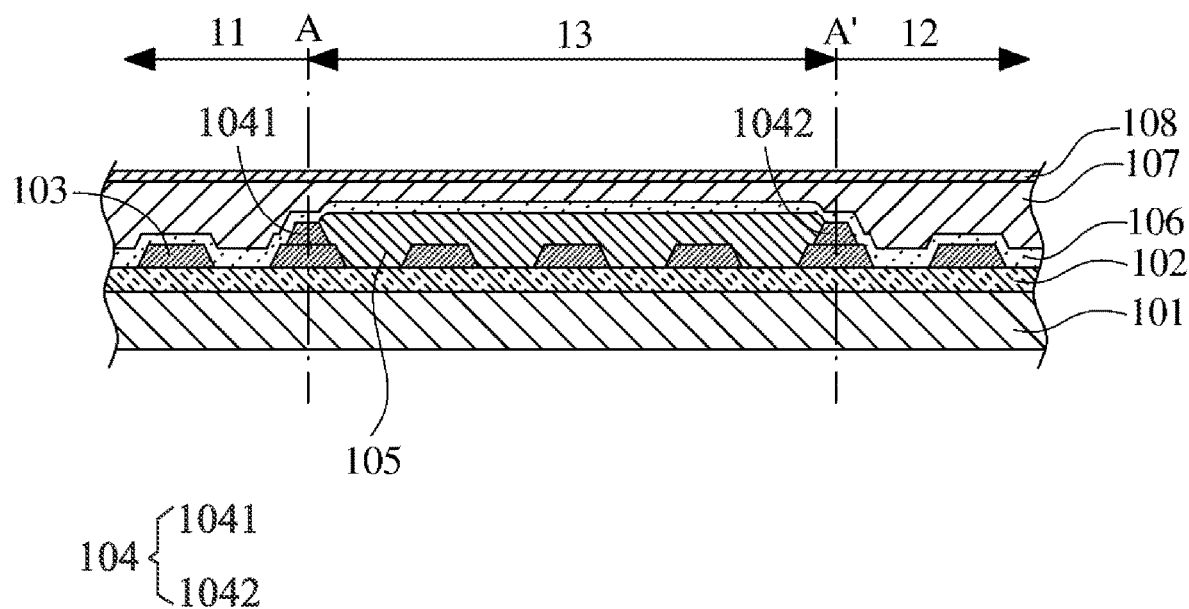
FIG. 2 is a cross-sectional view of a foldable OLED display panel according to one embodiment of the present disclosure.

Refer to FIG. 2. The foldable OLED display panel comprises a flexible functional layer 101, a planarization layer 102, a pixel definition layer 103, a spacer layer 104, a first organic layer 105, a first inorganic layer 106, a second organic layer 107, and a second inorganic layer 108.

The flexible functional layer 101 may include a substrate and a plurality of thin film transistor units, such as an array substrate and a protective layer, but they are not limited thereto. The substrate is for example a flexible plastic substrate.

The planarization layer 102 is disposed on the flexible functional layer 101.

The pixel definition layer 103 is disposed on the planarization layer 101.

The spacer layer 104 at least comprises a first spacer 1041 and a second spacer 1042. The first spacer 1041 is disposed on the first folding line A between the folding region 13 and the first display area 11 on the pixel definition layer 103. The second spacer 1042 is disposed on the second folding line A' between the folding region 13 and the second display area 12 on the pixel definition layer 103. The first organic layer 105, the first inorganic layer 106, the second organic layer 107 and the second inorganic layer 108 may form an encapsulation layer. The encapsulation layer is used for covering the pixel definition layer 103, the first spacer 1041, and the second spacer 1042 to protect the foldable OLED display panel.

In one embodiment of the present disclosure, the first spacer 1041 and the second spacer 1042 are photoresist spacer materials.

The first organic layer 105 is mainly coated within the folding region 13, and is restricted to the folding region 13 by the first spacer 1041 and the second spacer 1042. The first inorganic layer 106 is disposed on the first organic layer 105 and completely covers the effective display area 10 (as shown in FIG. 1). With this arrangement, the pixel definition layer 103 in the folding region 13 has flat topography, so that the first inorganic layer 106 in the folding region 13 has a flat surface to be less likely to crack when folded.

In one embodiment of the present disclosure, the first organic layer 105 is one or more of acrylic, epoxy resin, and silicone. In one embodiment of the present disclosure, the first inorganic layer 106 is silicon nitride, silicon oxynitride, silicon oxide, or aluminum oxide.

In one embodiment of the present disclosure, the second organic layer 107 and the second inorganic layer 108 sequentially cover the first inorganic layer 106, and completely cover the effective display area 10.

In one embodiment of the present disclosure, the second organic layer 107 is one or more of acrylic, epoxy resin, and silicone.

Figure 3:
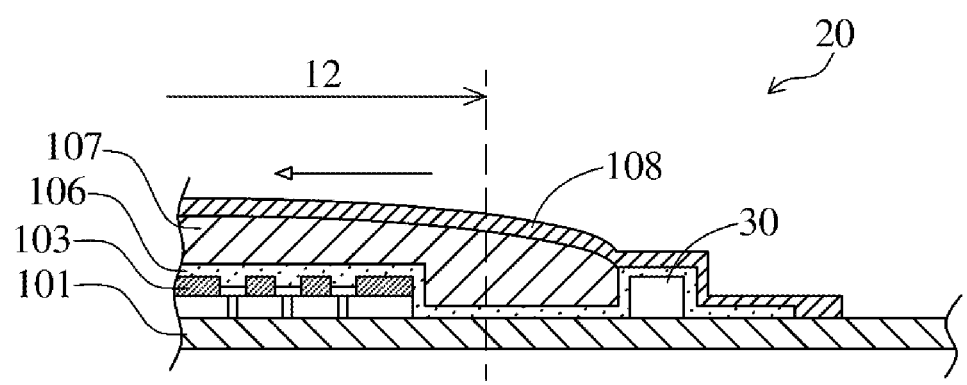
FIG. 3 is a schematic view showing a boundary of a display area in a foldable OLED display panel according to one embodiment of the present disclosure.

Refer to FIG. 3, in one embodiment of the present disclosure, a blocking wall 30 on the right side of the second display area 12 is used for blocking the second organic layer 107 from overflowing the encapsulation area. Similarly, although not shown, another blocking wall on the left side of the first display area 11 is also used for blocking the second organic layer 107 from overflowing the left encapsulation area. The second organic layer 107 has an edge located inside an edge of the first inorganic layer 106. The first inorganic layer 106 covers the pixel definition layer 103 and the blocking wall 30, and extends to a peripheral area on the right side of the blocking wall 30. The peripheral area belongs to a part of the non-display area 20. The second inorganic layer 108 completely covers the second organic layer 107 and the first inorganic layer 106, and the second inorganic layer 108 has an edge located on the right side of the blocking wall 30. In one embodiment of the present disclosure, the second inorganic layer 108 is silicon nitride, silicon oxynitride, silicon oxide, or aluminum oxide. In one embodiment of the present disclosure, the second inorganic layer 108 has an edge located outside an edge of the second organic layer 107.

The foldable organic light emitting diode display panel according to the present disclosure is applicable to an organic light emitting diode display screen.

According to a foldable organic light emitting diode display panel and an organic light emitting diode display screen of the present disclosure, the foldable organic light emitting diode display panel has an encapsulation layer comprising an organic layer for filling the gaps of a pixel definition layer in a folding region of the foldable organic light emitting diode display panel, such that an inorganic layer subsequently disposed on the pixel definition layer has a flat surface to reduce the risks of cracks in the foldable organic light emitting diode display panel during bending, and increase the service life of the foldable OLED display panel.

The present application has been described by the above related embodiments, but the above embodiments are merely examples for implementing the present application.

It must be noted that the disclosed embodiments do not limit the scope of the present application. Rather, modifications and equivalent arrangements included in the spirit and scope of the claims are intended to be included within the scope of the present application.

What is claimed is:

1. A foldable organic light emitting diode display panel, comprising an effective display area having a folding region, a first display area and a second display area, wherein the first display area and the second display area are disposed adjacent two lateral sides of the folding region, respectively;
   wherein the foldable organic light emitting diode display panel further comprises:
   a flexible functional layer;
   a planarization layer disposed on the flexible functional layer;
   a pixel definition layer disposed on the planarization layer;
   a first spacer disposed on a first folding line between the folding region and the first display area over the pixel definition layer;
   a second spacer disposed on a second folding line between the folding region and the second display area over the pixel definition layer; and
   an encapsulation layer covering the pixel definition layer, the first spacer and the second spacer;
   wherein the encapsulation layer comprises a first organic layer and a first inorganic layer, the first organic layer is restricted by the first spacer and the second spacer to be filled within the folding region, and
   the first inorganic layer is disposed on the first organic layer and completely covers the effective display area; and
   wherein the first organic layer is one or more of acrylics, epoxy resin, and silicone, the first spacer and the second spacer are photoresist spacer material, and the first inorganic layer is one or more of silicon nitride, silicon oxynitride, silicon oxide and aluminum oxide.

2. A foldable organic light emitting diode display panel, comprising an effective display area having a folding region, a first display area and a second display area, wherein the first display area and the second display area are disposed adjacent two lateral sides of the folding region, respectively;
   wherein the foldable organic light emitting diode display panel further comprises:
   a flexible functional layer;
   a planarization layer disposed on the flexible functional layer;
   a pixel definition layer disposed on the planarization layer;
   a first spacer disposed on a first folding line between the folding region and the first display area over the pixel definition layer;
   a second spacer disposed on a second folding line between the folding region and the second display area over the pixel definition layer; and
   an encapsulation layer covering the pixel definition layer, the first spacer and the second spacer;
   wherein the encapsulation layer comprises a first organic layer and a first inorganic layer, the first organic layer is restricted by the first spacer and the second spacer to be filled within the folding region, wherein the first spacer and the second spacer are photoresist spacer materials, and
   the first inorganic layer is disposed on the first organic layer and completely covers the effective display area.

3. The foldable organic light emitting diode display panel according to claim 2, wherein the encapsulation layer further comprises a second organic layer and a second inorganic layer sequentially coated on the first inorganic layer and completely covering the effective display area.

4. The foldable organic light emitting diode display panel according to claim 3, wherein the second organic layer is one or more of acrylic, epoxy resin, and silicone.

5. The foldable organic light emitting diode display panel according to claim 3, wherein the second organic layer has an edge located inside an edge of the first inorganic layer.

6. The foldable organic light emitting diode display panel according to claim 3, wherein the second inorganic layer is silicon nitride, silicon oxynitride, silicon oxide, or aluminum oxide.

7. The foldable organic light emitting diode display panel according to claim 3, wherein the second inorganic layer has an edge located outside an edge of the second organic layer.

8. The foldable organic light emitting diode display panel according to claim 2, wherein the first organic layer is one or more of acrylic, epoxy resin, and silicone.

9. The foldable organic light emitting diode display panel according to claim 2, wherein the first inorganic layer is silicon nitride, silicon oxynitride, silicon oxide, or aluminum oxide.

10. An organic light emitting diode display screen, comprising the foldable organic light emitting diode display panel according to claim 2.

11. The organic light emitting diode display screen according to claim 10, wherein the encapsulation layer further comprises a second organic layer and a second inorganic layer sequentially coated on the first inorganic layer and completely covering the effective display area.

12. The organic light emitting diode display screen according to claim 11, wherein the second organic layer has an edge located inside an edge of the first inorganic layer.

13. The organic light emitting diode display screen according to claim 11, wherein the second inorganic layer is silicon nitride, silicon oxynitride, silicon oxide, or aluminum oxide.

14. The organic light emitting diode display screen according to claim 10, wherein the second organic layer is one or more of acrylic, epoxy resin, and silicone.

15. The organic light emitting diode display screen according to claim 14, wherein the second inorganic layer has an edge located outside an edge of the second organic layer.

16. The organic light emitting diode display screen according to claim 10, wherein the first organic layer is one or more of acrylic, epoxy resin, and silicone.

17. The organic light emitting diode display screen according to claim 10, wherein the first inorganic layer is silicon nitride, silicon oxynitride, silicon oxide, or aluminum oxide.

* * * * *